(12) United States Patent
Yun

(10) Patent No.: US 7,592,687 B2
(45) Date of Patent: Sep. 22, 2009

(54) DEVICE AND METHOD FOR PREVENTING AN INTEGRATED CIRCUIT FROM MALFUNCTIONING DUE TO SURGE VOLTAGE

(75) Inventor: Young-Hwan Yun, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 9 days.

(21) Appl. No.: 11/352,557

(22) Filed: Feb. 13, 2006

(65) Prior Publication Data
US 2006/0181825 A1    Aug. 17, 2006

(30) Foreign Application Priority Data
Feb. 11, 2005    (KR) .................. 10-2005-0011558

(51) Int. Cl.
*H01L 23/62* (2006.01)
*H01L 23/552* (2006.01)

(52) U.S. Cl. ........................ 257/659; 257/355
(58) Field of Classification Search .............. 257/659, 257/660, 355–367, E29.008, E29.015
See application file for complete search history.

(56) References Cited

U.S. PATENT DOCUMENTS

| | | | | | |
|---|---|---|---|---|---|
| 3,818,279 | A | * | 6/1974 | Seeger et al. ............ | 361/751 |
| 4,345,302 | A | * | 8/1982 | Kurose .................... | 361/512 |
| 6,459,046 | B1 | * | 10/2002 | Ochi et al. ............... | 174/256 |
| 6,492,599 | B1 | * | 12/2002 | Sugihara .................. | 174/258 |
| 2002/0196594 | A1 | | 12/2002 | Cohen ..................... | 361/91.1 |
| 2003/0012004 | A1 | * | 1/2003 | Uehara .................... | 361/748 |
| 2005/0155507 | A1 | * | 7/2005 | Vaidyanathan et al. ..... | 101/483 |

FOREIGN PATENT DOCUMENTS

| | | |
|---|---|---|
| CN | 1539255 A | 10/2004 |
| JP | 09-036582 | 2/1997 |
| KR | 10-2003-0033825 | 5/2003 |
| KR | 10-2003-0096140 | 12/2003 |

OTHER PUBLICATIONS

Notice of Office Action issued by the Chinese Patent Office on Jan. 16, 2009 during examination of the corresponding Chinese application.

* cited by examiner

*Primary Examiner*—Cuong Q Nguyen
(74) *Attorney, Agent, or Firm*—F. Chau & Assoc., LLC

(57) ABSTRACT

A device and method for preventing an integrated circuit from malfunctioning due to a surge voltage are provided. The device which is interposed between a node and a ground in the integrated circuit includes: a first material which is conductive; and a second material which is insulative, wherein a surface of the second material contacts a surface of the first material.

22 Claims, 3 Drawing Sheets

DEVICE AND METHOD FOR PREVENTING AN INTEGRATED CIRCUIT FROM MALFUNCTIONING DUE TO SURGE VOLTAGE

CROSS-REFERENCE TO RELATED PATENT APPLICATION

This application claims priority to Korean Patent Application No. 10-2005-0011558, filed on Feb. 11, 2005, in the Korean Intellectual Property Office, the disclosure of which is incorporated by reference herein in its entirety.

BACKGROUND OF THE INVENTION

1. Technical Field

The present invention relates to an integrated circuit, and more particularly, to a device and a method for preventing an integrated circuit from malfunctioning due to a surge voltage.

2. Discussion of the Related Art

An integrated circuit is an electronic circuit typically manufactured on a thin substrate of semiconductor material. As integrated circuit technology has matured, the size and operating voltages of integrated circuits and devices employing integrated circuits have decreased considerably.

Although the development of such integrated circuits has led to the proliferation of integrated circuit devices such as portable terminals, for example, cell phones and digital cameras, these devices are easily affected by suddenly applied voltages. In other words, when a surge voltage such as static electricity is applied to a portable terminal, the portable terminal may malfunction or its operability may deteriorate.

In general, a portable terminal is provided with a conductive metal on its surface to enable the portable terminal to be resistant to external forces and to be more aesthetic. A voltage of the conductive metal should not be higher than a predetermined reference voltage with respect to ground when a charged battery is attached to the portable terminal. Otherwise, a user who is carrying the portable terminal is in danger of receiving an electric shock since the conductive metal can have, for example, an alternating current (AC) voltage of about 80-90V, when it is short-circuited with the ground. Therefore, the conductive metal is typically kept in a floating state when it is not short-circuited with the ground.

However, if static electricity is applied to the conductive metal while it is in the floating state, circuit components inside the portable terminal can malfunction. In other words, when static electricity, a direct current (DC) voltage or an AC voltage are applied to or are present at the conductive metal, the performance of the portable terminal may be adversely affected.

FIG. 1A is a cross-sectional view of a general portable terminal 100.

FIG. 1B is a graph illustrating a voltage of a conductive metal on a surface of the portable terminal of FIG. 1A with respect to time.

Referring to FIG. 1A, the portable terminal 100 includes a conductive metal 110 formed on an outer surface thereof, a metal 120 for withstanding externally applied pressures, a circuit component 130 that is used to perform a function of the portable terminal 100, and a case 140.

Static electricity applied to the portable terminal 100 is discharged twice. The first discharge is referred to as a 'first discharge' SE1 and the second discharge is referred to as a 'second discharge' SE2. The first discharge SE1 indicates that the static electricity is applied to the conductive metal 110, and the second discharge SE2 indicates that the first discharge SE1 is also applied to the metal 120.

Referring now to FIG. 1B, (ii) is a waveform illustrating a voltage of the metal 120 when static electricity is applied to the metal 120. As shown by the waveform (ii), since the applied static electricity can be discharged by short-circuiting the metal 120 to ground, the voltage is not high.

However, when static electricity is applied to the conductive metal 110, a voltage of the conductive metal 110 rises as shown by a waveform (i) since the conductive metal 110 is in a floating state. In other words, the voltage of the conductive metal 110 is momentarily increased because there is no path through which the applied static electricity can be discharged, therefore increasing the possibility that the circuit component 130 will not operate properly.

Similarly, when the conductive metal 110 is connected to ground to reduce the effects of static electricity, if a DC or AC voltage is present at the conductive metal 110, the circuit component 130 may malfunction. Further, even when the static electricity is applied to the conductive metal 110, the voltage of the conductive metal 110 is similar to the waveform (ii).

As such a need exists for a technique of reducing the effects of a surge voltage on an integrated circuit device so that circuit components thereof can operate properly.

SUMMARY OF THE INVENTION

A device and method for preventing an integrated circuit from malfunctioning due to a surge voltage are provided.

According to an aspect of the present invention, there is provided a device for preventing an integrated circuit from malfunctioning due to a surge voltage, wherein the device is interposed between a node and a ground in the integrated circuit, the device comprising: a first material that is conductive; and a second material that is insulative, wherein a surface of the second material contacts a surface of the first material.

When a first surface of the second material contacts a second surface of the first material a first surface of the first material is connected to the node and a second surface of the second material is connected to the ground, and when the second surface of the second material contacts the first surface of the first material the second surface of the first material is connected to the ground and the first surface of the second material is connected to the node.

The device may discharge static electricity but not a direct current (DC) voltage and an alternating current (AC) voltage. The surge voltage may include static electricity and DC and AC voltages.

The first material may be an electromagnetic interference (EMI) absorbing material. The first material may be a thin layer material comprising rubber including a conductive material.

The second material may be a thin layer material having holes. The second material may be a thin layer of paper or a thin layer of cloth. The node may be a conductor on a surface of the integrated circuit.

According to another aspect of the present invention, there is provided a method of preventing an integrated circuit from malfunctioning due to a surge voltage, the method comprising: positioning a device for preventing the integrated circuit from malfunctioning between a node and a ground in the integrated circuit, wherein positioning the device comprises: connecting a first surface of a first material to the node; and connecting a second surface of a second material to the ground or connecting the first surface of the first material to the ground; and connecting the second surface of the second material to the node.

The device for preventing the integrated circuit from malfunctioning may comprise: the first material which is conductive and includes the first surface and a second surface; and the second material which is insulative and includes a first surface and the second surface, wherein the second surface of the first material contacts the first surface of the second material.

The method further comprises: discharging static electricity but not a direct current (DC) voltage and an alternating current (AC) voltage. The surge voltage may include static electricity and DC and AC voltages.

The first material may be an electromagnetic interference (EMI) absorbing material. The first material may be a thin layer material comprising rubber including a conductive material.

The second material may be a thin layer material having holes. The second material may be a thin layer of paper or a thin layer of cloth. The node may be a conductor on a surface of the integrated circuit.

According to still another aspect of the present invention, there is provided a device for preventing an integrated circuit from malfunctioning due to static electricity, the device comprising: a conductive material; and an insulative material, wherein the conductive material and the insulative material are disposed between a conductor on an outer surface of the integrated circuit and a ground of the integrated circuit, and wherein a surface of the insulative material contacts a surface of the conductive material.

The conductive material is an electromagnetic interference (EMI) absorbing material. The conductive material is a thin layer material comprising rubber having densely packed fine conductive materials.

The insulative material is a thin layer material having minute holes. The insulative material is a thin layer of paper or a thin layer of cloth.

The device discharges static electricity applied to the conductor but not a direct current (DC) voltage and an alternating current (AC) voltage.

When a first surface of the insulative material contacts a second surface of the conductive material a first surface of the conductive material is connected to the node and a second surface of the insulative material is connected to the ground, and when the second surface of the insulative material contacts the first surface of the conductive material the second surface of the conductive material is connected to the ground and the first surface of the insulative material is connected to the node.

BRIEF DESCRIPTION OF THE DRAWINGS

The above and other features of the present invention will become more apparent by describing in detail exemplary embodiments thereof with reference to the attached drawings in which.

DETAILED DESCRIPTION OF EXEMPLARY EMBODIMENTS

Figure 1A:
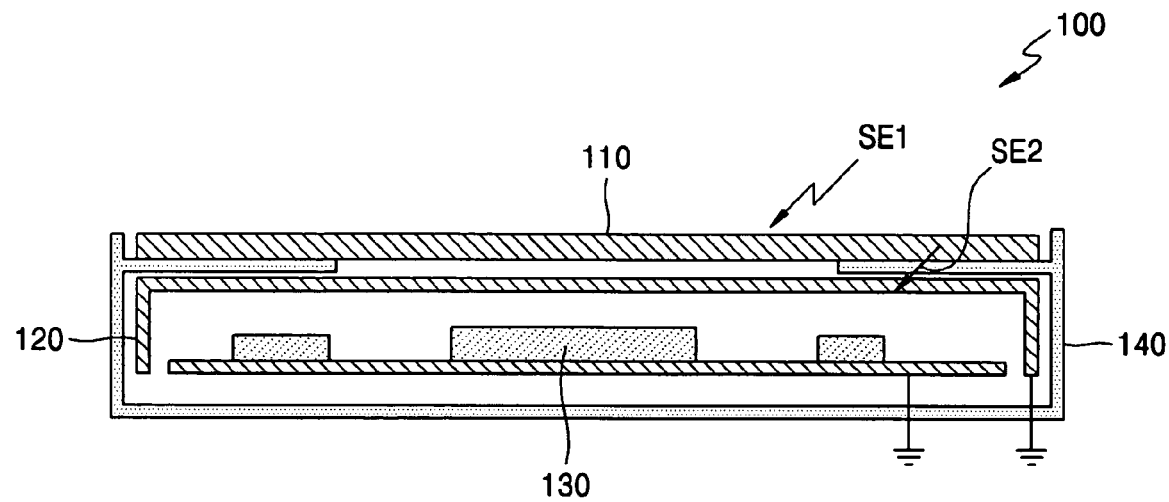
FIG. 1A is a cross-sectional view of a general portable terminal.
Figure 1B:
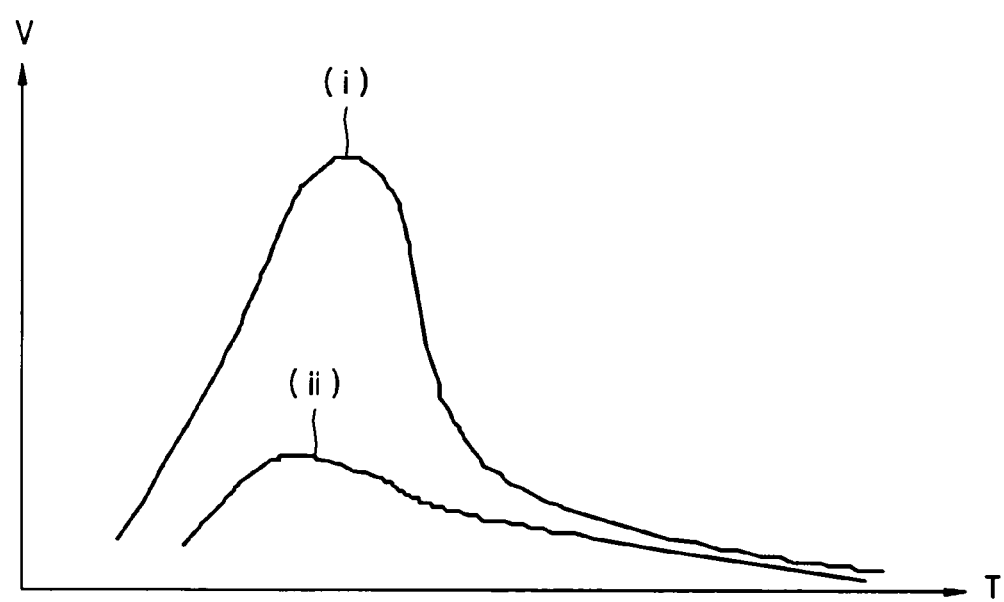
FIG. 1B is a graph illustrating a voltage of a conductive metal on an outer surface of the portable terminal of FIG. 1A with respect to time.

Hereinafter, exemplary embodiments of the present invention will be described in detail with reference to the attached drawings. Like reference numerals in the drawings denote like elements.

Before describing the exemplary embodiments of the present invention it is to be understood by one of ordinary skill in the art that a surge voltage is a momentarily applied voltage which may vary in form and level. The surge voltage to be described hereinafter is in the form of static electricity although, in some instances, it may be referred to as including direct current (DC) or alternating current (AC) voltages.

Figure 2:
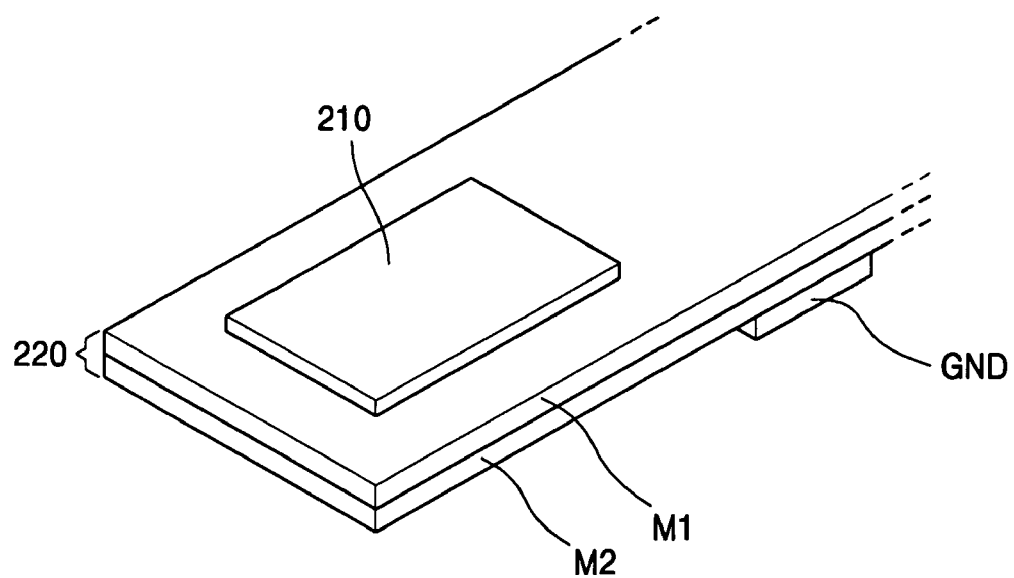
FIG. 2 is a diagram of a device for preventing an integrated circuit from malfunctioning according to an exemplary embodiment of the present invention.

FIG. 2 is a diagram of a device 220 for preventing an integrated circuit from malfunctioning due to a surge voltage according to an embodiment of the present invention.

Referring to FIG. 2, the device 220 includes a first material M1 which is conductive and a second material M2 which is insulative. The second material M2 contacts a surface of the first material M1.

The device 220 is interposed between a node 210 and ground GND in an integrated circuit (not shown). The integrated circuit can have different forms and will hereinafter be interchangeably referred to as a portable terminal.

The node 210 is a conductor located on an outermost surface of the integrated circuit. In other words, the node 210 may be a conductive material located on the outermost surface of the portable terminal. The node 210 may be similar to that of the conductive metal 110 of FIG. 1A.

The device 220 is connected between the conductive material and the ground GND, and discharges static electricity but not direct current (DC) or alternating current (AC) voltages.

In other words, the device 220 is nearly infinitely resistant to the DC and AC voltages while discharging the static electricity applied to the node 210 to the ground GND.

For example, when static electricity of several kilovolts is applied to the device 220 at a location very close (for example, about 1 mm) to the ground GND, the static electricity can be discharged to the ground GND without directly contacting the ground GND. Thus, metals that are charged with a DC or AC voltage below 100 volts are not electrically connected with each other unless the metals are already directly in contact with each other.

In other words, since the first and second materials M1 and M2 are connected between the node 210 and ground GND, the effects due to the DC and AC voltages are reduced or eliminated by the second material M2 and static electricity is discharged to the ground GND since the first material M1 is disposed very close to the ground GND.

It is to be understood by one of ordinary skill in the art that although a first surface of the first material M1 is connected to the node 210 and a second surface of the second material M2 is connected to the ground GND as shown in FIG. 2, the second surface of the second material M2 can be connected to the node 210 and the first surface of the first material M1 can be connected to the ground GND.

Figure 3:
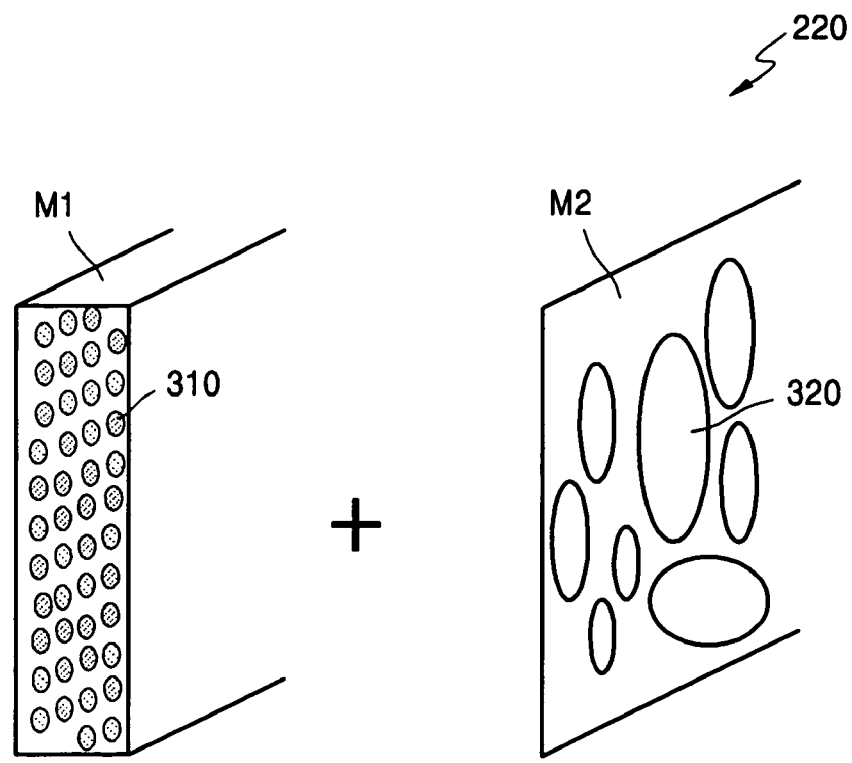
FIG. 3 is a diagram illustrating the device of FIG. 2 in more detail.

FIG. 3 is a diagram illustrating the first material M1 and the second material M2 of the device 220 of FIG. 2 in more detail.

As shown in FIG. 3, the first material M1 may be an electromagnetic interference (EMI) absorbing material. For example, the first material M1 may be a thin layer material consisting of rubber containing densely packed fine conductive materials 310. The fine conductive materials 310 may be metal particles.

When fine metal particles are densely packed in a thin layer consisting of rubber as shown in FIG. 3, static electricity can move through the metal particles.

The second material M2 may be a thin insulative layer material containing minute holes 320. For example, the second material M2 may be an extremely thin paper or cloth. When one surface of the first material M1 is covered with the second material M2, which may be a thin paper or cloth, a direct current or alternating current cannot pass. However, static electricity can conduct through the holes 320.

As further shown in FIG. 3, although the second material M2 contacts one surface of the first material M1, it may also enclose the first material M1, thus covering more than one surface of the first material M1.

It is to be understood by one of ordinary skill in the art that other materials capable of absorbing electromagnetic waves can be used in addition to the EMI absorbing material described above as the first material M1. Further, it should also be understood by one of ordinary skill in the art that other insulative materials containing holes can be used in addition to the paper or cloth described above as the second material M2.

Figure 4:
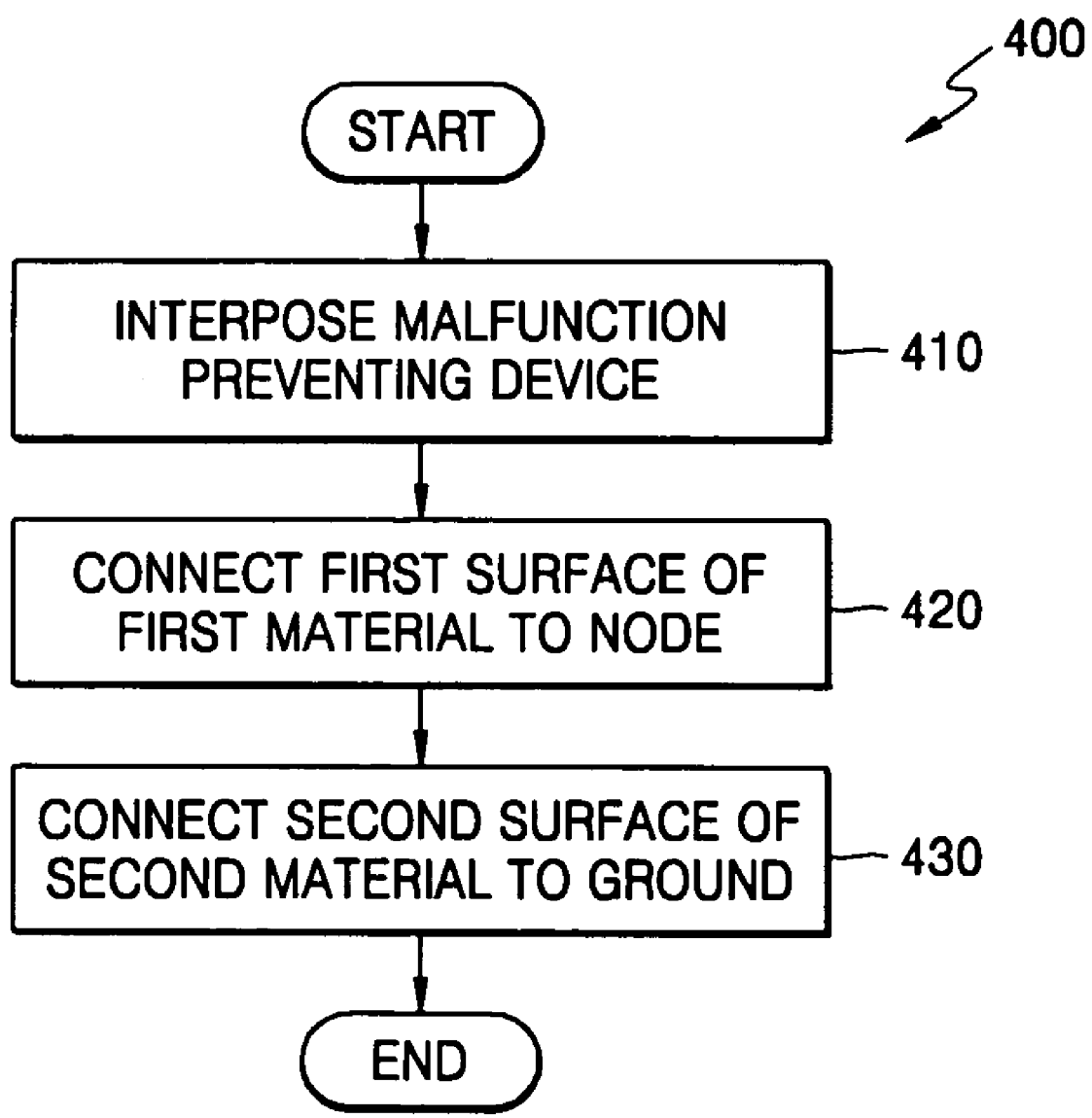
FIG. 4 is a flowchart illustrating a method of preventing an integrated circuit from malfunctioning according to an exemplary embodiment of the present invention.

FIG. 4 is a flowchart illustrating a method 400 of preventing an integrated circuit from malfunctioning according to an embodiment of the present invention.

Since the device for preventing the integrated circuit from malfunctioning is the same as the device 220 illustrated in FIGS. 2 and 3, a detailed description thereof will be omitted.

Referring to FIG. 4, in operation 410, a device for preventing the integrated circuit from malfunctioning is first interposed between the node 210 and the ground GND, in the integrated circuit.

In operation 420, the first surface of the first material M1 is connected to the node 210. As described above with reference to FIG. 2, the node 210 is a conductive metal on the outermost surface of the integrated circuit. Next, in operation 430, a second surface of the second material M1 is connected to the ground GND.

According to an exemplary embodiment of the present invention, the device and method for preventing an integrated circuit from malfunctioning due to a surge voltage can effectively discharge static electricity applied to a conductor on the outermost surface of the integrated circuit and prevent the integrated circuit from malfunctioning due to DC and AC voltages.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A device preventing an integrated circuit device from malfunctioning due to a surge voltage containing static electricity, wherein the device is interposed between an electrically conductive node of the integrated circuit device and a ground, the device comprising:
a first layer formed of a first material that is conductive and that passes static electricity; and
a second layer formed of a second material that is insulative and that passes static electricity and blocks a direct current (DC) voltage and an alternating current (AC) voltage,
wherein a surface of the second layer contacts a surface of the first layer,
wherein the insulative material of the second layer is a thin material having a plurality of minute holes that pass the static electricity and that block the direct current (DC) voltage and the alternating current (AC) voltage.

2. The device of claim 1, wherein when a first surface of the second layer contacts a second surface of the first layer, a first surface of the first layer is connected to the electrically conductive node and a second surface of the second layer is connected to the ground.

3. The device of claim 1, wherein the device discharges static electricity through the first and second layers and blocks a direct current (DC) voltage and an alternating current (AC) voltage.

4. The device of claim 3, wherein the surge voltage includes the static electricity and the DC and AC voltages.

5. The device of claim 1, wherein the material of the first layer is an electromagnetic interference (EMI) absorbing material.

6. The device of claim 1, wherein the material of the first layer is a thin material comprising rubber including electrically conductive particles.

7. The device of claim 1, wherein the insulative material of the second layer is a thin paper or a thin cloth.

8. The device of claim 1, wherein the electrically conductive node is an outer surface conductor of the integrated circuit device.

9. The device of claim 1, wherein when a second surface of the second layer contacts a first surface of the first layer, the second surface of the first layer is connected to the ground and the first surface of the second layer is connected to the electrically conductive node.

10. A method of preventing an integrated circuit device from malfunctioning due to a surge voltage containing static electricity, the method comprising:
positioning a device for preventing the integrated circuit device from malfunctioning between an electrically conductive node of the integrated circuit device and a ground,
wherein the device comprises:
a first layer formed of a first material that is conductive and that includes a first surface and a second surface and that passes static electricity; and
a second layer formed of a second material that is insulative and that includes a first surface and a second surface, wherein the second surface of the first layer contacts the first surface of the second layer and wherein the second material passes static electricity and blocks a direct current (DC) voltage and an alternating current (AC) voltage,
wherein the insulative material of the second layer is a thin material having a plurality of minute holes that pass the static electricity and that block the direct current (DC) voltage and the alternating current (AC) voltage,
wherein positioning the device comprises:
connecting the first surface of the first layer to the node; and
connecting the second surface of the second layer to the ground, or
connecting the first surface of the first layer to the ground; and
connecting the second surface of the second layer to the node,
whereby static electricity passes between the node and the ground.

11. The method of claim 10, further comprising:
discharging static electricity but not the direct current (DC) voltage and the alternating current (AC) voltage.

12. The method of claim 11, wherein the surge voltage includes the static electricity and the DC and AC voltages.

13. The method of claim 10, wherein the material of the first layer is an electromagnetic interference (EMI) absorbing material.

14. The method of claim 10, wherein the material of the first layer is a thin material comprising rubber including an electrically conductive material.

15. The method of claim 10, wherein the insulative material of the second layer is a thin paper or a thin cloth.

16. The method of claim 10, wherein the electrically conductive node is an outer surface conductor of the integrated circuit device.

17. A device preventing an integrated circuit device from malfunctioning due to static electricity, comprising:
a first layer formed of a conductive material that discharges static electricity; and
a second layer formed of an insulative material that blocks a direct current (DC) voltage and an alternating current (AC) voltage,
wherein the insulative material of the second layer is a thin material having a plurality of minute holes that pass the static electricity and that block the direct current (DC) voltage and the alternating current (AC) voltage,
wherein the conductive material and the insulative material are disposed between an outer surface conductor of the integrated circuit device and a ground, and
wherein a surface of the insulative material of the second layer contacts a surface of the conductive material of the first layer.

18. The device of claim 17, wherein the conductive material of the first layer is an electromagnetic interference (EMI) absorbing material.

19. The device of claim 17, wherein the conductive material of the first layer is a thin material comprising rubber having densely packed fine conductive materials.

20. The device of claim 17, wherein the insulative material of the second layer is a thin paper or a thin cloth.

21. The device of claim 17, wherein the device discharges to the ground static electricity applied to the conductor and blocks a direct current (DC) voltage and an alternating current (AC) voltage.

22. The device of claim 17, wherein when a first surface of the second layer of insulative material contacts a second surface of the first layer of conductive material, a first surface of the first layer of conductive material is connected to the conductor and a second surface of the second layer of insulative material is connected to the ground, and when the second surface of the second layer of insulative material contacts the first surface of the first layer of conductive material, the second surface of the first layer of conductive material is connected to the ground and the first surface of the second layer of insulative material is connected to the conductor.

* * * * *